United States Patent [19]

Andresen

[11] Patent Number: 4,733,214
[45] Date of Patent: Mar. 22, 1988

[54] MULTI-DIRECTIONAL CONTROLLER HAVING RESILIENTLY BIASED CAM AND CAM FOLLOWER FOR TACTILE FEEDBACK

[76] Inventor: Herman J. Andresen, 1014 Central Rd., Glenview, Ill. 60025

[21] Appl. No.: 932,461

[22] Filed: Nov. 18, 1986

Related U.S. Application Data

[62] Division of Ser. No. 496,843, May 23, 1983, Pat. No. 4,639,667.

[51] Int. Cl.$^4$ ............................................. H01C 10/16
[52] U.S. Cl. .................................. 338/128; 338/32 R; 324/208
[58] Field of Search ............................ 338/128, 32 R; 74/471 XY, 491; 324/207, 208

[56] References Cited

U.S. PATENT DOCUMENTS

| | | | |
|---|---|---|---|
| 2,852,732 | 9/1958 | Weiss | 323/94 |
| 3,128,625 | 4/1964 | Heineman | 73/209 |
| 3,267,404 | 3/1964 | Hieronymus | 338/32 |
| 3,305,770 | 2/1967 | Hulls | 338/32 |
| 3,331,972 | 7/1967 | Moller | 338/324 |
| 3,395,341 | 7/1968 | Malaquin | 324/70 |
| 3,421,227 | 11/1969 | Turner et al. | 324/207 |
| 3,462,673 | 8/1969 | Hieronymus | 323/69 |
| 3,474,332 | 10/1969 | Brown | 324/34 |
| 3,691,502 | 9/1972 | Kataoka | 338/32 |
| 3,698,531 | 10/1972 | Bernin | 197/98 |
| 3,718,872 | 6/1971 | Takeuchi | 332/51 R |
| 3,753,202 | 8/1973 | Kataoka et al. | 338/32 H |
| 3,818,326 | 6/1974 | Masuda et al. | 324/34 PS |
| 3,958,202 | 5/1976 | Sidor | 336/110 |
| 3,958,203 | 5/1976 | Bernin | 336/110 |
| 3,988,710 | 10/1976 | Sidor et al. | 338/32 R |
| 4,088,977 | 5/1978 | Bowman, Jr. et al. | 338/32 |
| 4,121,185 | 10/1978 | Genz | 336/110 |
| 4,137,512 | 1/1979 | Sidor | 335/206 |
| 4,229,993 | 10/1980 | Andresen | 74/538 |
| 4,332,177 | 6/1982 | Andresen | 74/491 |
| 4,459,578 | 7/1984 | Sava et al. | 330/324 |
| 4,490,710 | 12/1984 | Kopsho, Jr. et al. | 338/128 |
| 4,507,601 | 3/1985 | Andresen | 323/347 |
| 4,555,960 | 12/1985 | King | 338/128 X |
| 4,574,286 | 3/1986 | Andresen | 340/870.31 |
| 4,587,510 | 5/1986 | Kim | 338/128 |

OTHER PUBLICATIONS

Licon Product Bulletin PS-1000, Series 33 Position Sensors and Signal Conditioner (Illinois Tool Works, 1979) (4 pp.).

"Inductive Component Description," Inductive Control Systems, Bridgeport, Conn. (1 page).

*Primary Examiner*—E. A. Goldberg
*Assistant Examiner*—M. M. Lateef
*Attorney, Agent, or Firm*—Richard C. Auchterlonie

[57] ABSTRACT

A multi-directional contactless controller senses the displacement of a manipulator with respect to a reference frame along two orthogonal directions and is also provided with a resiliently biased cam and cam follower disposed between the manipulator and the reference frame for providing tactile feedback and returning the manipulator to a central position. For specific applications, the cam surface is programmed with various regions having different restoring forces or rest positions. Access to these regions can be conditioned by selectively activated solenoids or by a requirement for overt operator input. Similarly, a selectively activated solenoid can be used to conditionally prohibit exit from these regions or to selectively return the controller to the central null position.

20 Claims, 19 Drawing Figures

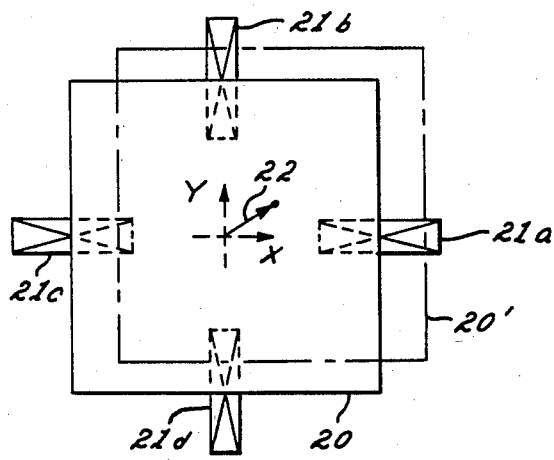
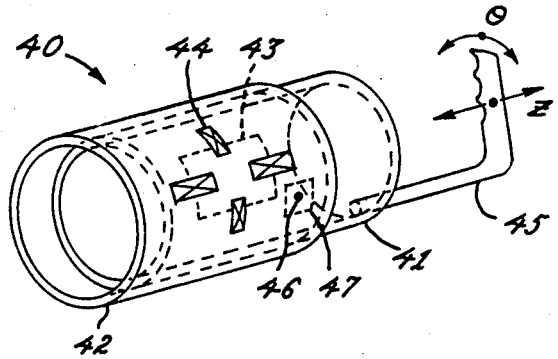
FIG. 1
FIG. 4
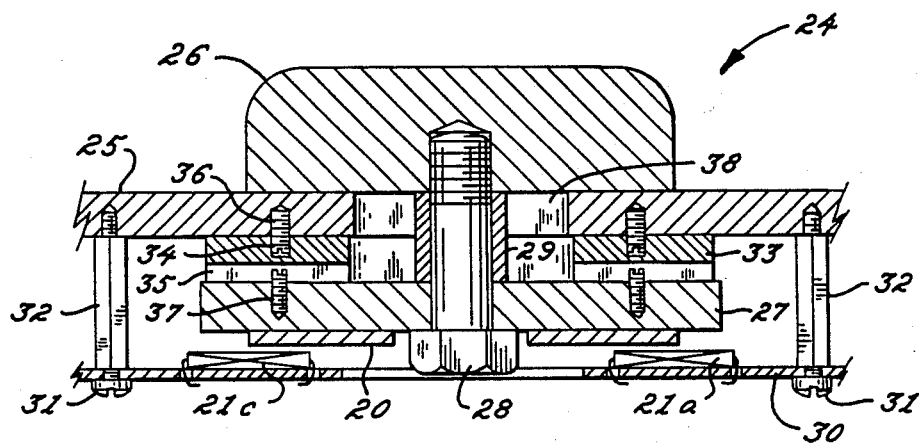
FIG. 2
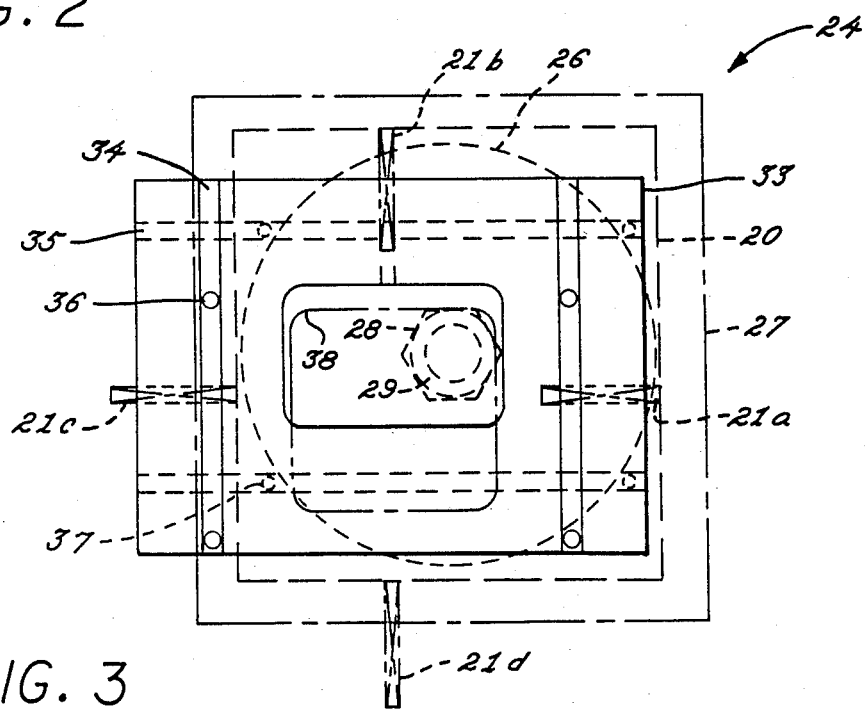
FIG. 3

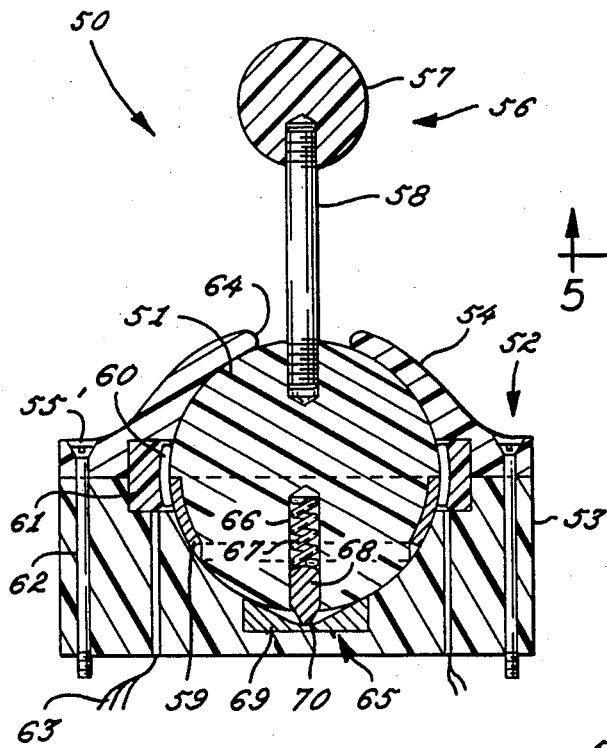
FIG. 5
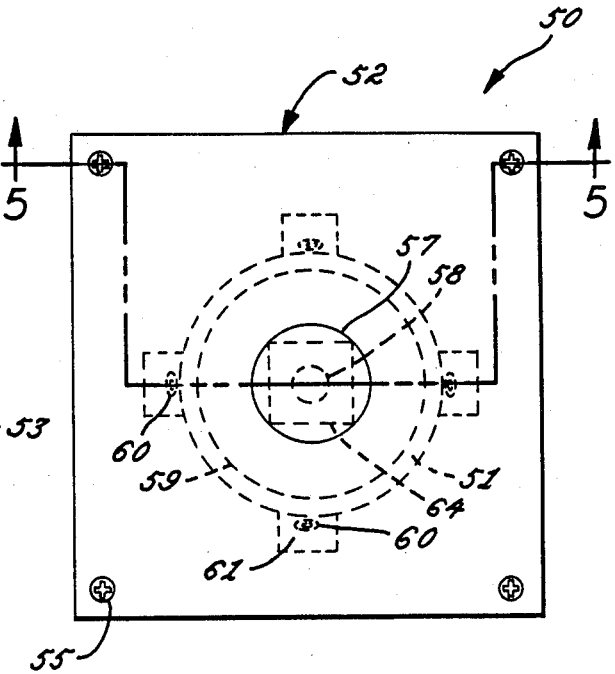
FIG. 6
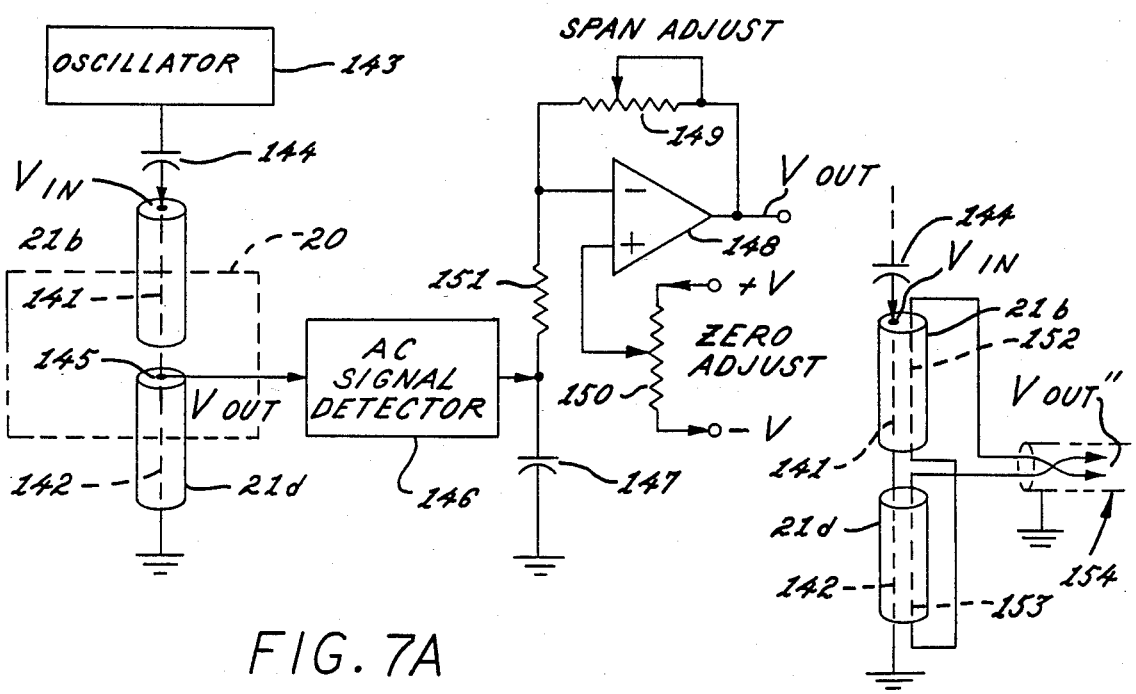
FIG. 7A
FIG. 7B

MULTI-DIRECTIONAL CONTROLLER HAVING RESILIENTLY BIASED CAM AND CAM FOLLOWER FOR TACTILE FEEDBACK

RELATED APPLICATIONS

The present application is a continuation-in-part of Andresen U.S. application Ser. No. 496,843 filed May 23, 1983, now U.S. Pat. No. 4,639,667 issued January 27, 1987.

BACKGROUND OF THE INVENTION

The present invention relates to the field of contactless controllers wherein the displacement of a carrier with respect to a reference frame is sensed without requiring an electrical contact between the carrier and reference frame. Controllers find application in such diverse areas as construction and agricultural vehicles, video games, computer graphics, robotics, and remote control. The controller serves as an interface between a human being and a computer or control system. The controller generates electrical signals in response to being manipulated by the user.

One convenient method of contactless sensing uses a magnet to establish a magnetic field and the displacement of the magnet with respect to a magnetically saturable core is sensed by the proportional part of the core which is saturated. Once saturation of a part of the core is achieved, any variation in the strength of the magnetic field is inconsequential. This principle has been applied to rotary and linear displacement sensors. A somewhat similar scheme senses the displacement of a magnet with respect to a semiconductor element exhibiting a magnetoresistive effect. The relative change in resistance of the semiconductor element is limited by the magnetic field strengths attainable with currently available magnets, however, and the response of the element is nonlinear and never achieves saturation. Thus, a magnetoresistive sensor is always responsive to variations in the magnetic field strength such as are caused by temperature variations, gap variations, and aging as well as changes due to displacement of the magnet. Kataoka et al. U.S. Pat. No. 3,691,502 issued Sept. 12, 1972, discloses that it is possible to obtain a device of this sort for detecting two-dimensional displacement by assembling two perpendicularly combined magnetoresistive devices. See FIGS. 33, 34. In FIG. 34, the magnetic field is of square shape having a central square space and takes a symetrical position over the magnetoresistive devices in the case of zero displacement. It is said that the voltages produced at center terminals independently measure the displacement in the orthogonal directions because the portions applied with magnetic field along one orthogonal direction are not changed by the displacement of the magnetic field in the other orthogonal direction. See Column 11, line 37 - Column 12, line 27. Kataoka et al. further described their magnetoresistive devices in U.S. Pat. No. 3,753,202 issued Aug. 14, 1973.

Another method of contactless sensing uses a differential transformer. Moller U.S. Pat. No. 3,331,972, for example, discloses a joy-stick controller which senses the angular tilt of a spherical member about each of two orthogonal axes. The spherical member includes a ferromagnetic core for a two-phase differential transformer. The spherical member also includes a recess into which a switch member yields when the spherical member is placed in its central position. The switch interrupts the current supplied to the excitation coils of the differential transformer, so that no displacement indicating signals are generated when the joy stick is in its central position.

SUMMARY OF THE INVENTION

The general aim of the present invention is to provide multi-directional contactless controllers that are rugged, reliable, and economical to manufacture.

A specific object of the present invention is to provide programmable and selectable tactile feedback to the operator.

Another object of the invention is to provide a multi-directional controller with precisely programmed offset and return forces.

Still another object of the invention is to provide a more reliable mechanism for returning a multi-directional controller to its null position in the event that the controller becomes unattended in an emergency situation.

Moreover, another object of the invention is to provide a multi-directional controller which requires overt manual input in order to permit the manipulator of the controller to be displaced toward or away from certain programmed regions.

The present invention is advantageously used with contactless sensors which are responsive to the displacement of a carrier with respect to a reference frame in two generally orthogonal directions, thereby eliminating the need for mechanical components to resolve the displacement of the carrier into independent orthogonal linear displacements. The carrier and frame can be made having planar cylindrical or spherical geometries.

To provide for programmable tactile feedback in accordance with the present invention, a spring-loaded cam follower and a cam surface are disposed between the carrier and the frame of the controller. The cam follower, for example, includes a hardened steel ball bearing. The cam surface typically is programmed to provide a return force to a central null position. For specific applications, the cam surface is programmed with various regions having different restoring forces or rest positions. Access to these regions can be conditioned by selectively activated solenoids or by a requirement for overt operator input. Similarly, a selectively activated solenoid can be used to conditionally prohibit entry into or exit from these regions or to selectively return the controller to the central null position.

BRIEF DESCRIPTION OF THE DRAWINGS

Other objects and advantages of the present invention will become apparent upon reference to the drawings, in which:

FIG. 1 is a pictorial plan view of a carrier and sensor arrangement having a generally square magnet;

FIG. 2 is a cross-sectional elevation of a planar geometry embodiment of a multi-directional contactless controller using the magnet and sensor geometry shown in FIG. 1;

FIG. 3 is a plan view of the guiding means in the planar embodiment of FIG. 2, the other components being shown in phantom lines to illustrate the positions of the manipulator, carrier, and guide with respect to the frame when the manipulator and carrier assume an extreme upper right position;

FIG. 4 is a pictorial diagram, in perspective, illustrating a cylindrical embodiment of the invention;

FIG. 5 is a cross-sectional elevation view of a spherical "joystick" embodiment of the present invention along section line 5—5 of FIG. 6;

FIG. 6 is a plan view of the joystick shown in FIG. 5;

FIGS. 7A and 7B are schematic diagrams of circuits for convert the differential saturation of two cores to a usable output signal;

DESCRIPTION OF THE PREFERRED EMBODIMENTS

Figures 8A, 8B, 9:
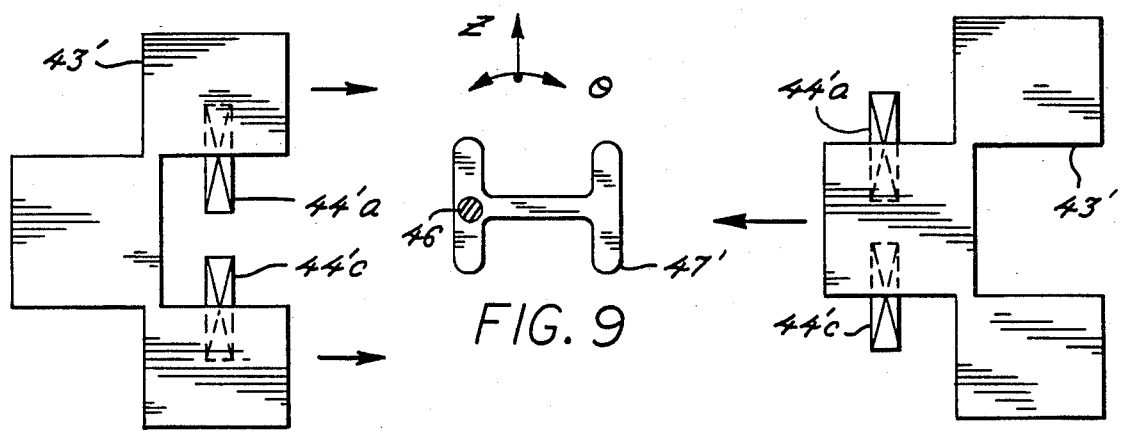
FIGS. 8A and 8B are pictorial diagrams illustrating a magnet and sensor geometry for providing a contactless controller which has a linear output in one direction, the polarity of the output being switched in response to motion in a second orthogonal direction.
FIG. 9 is a pictorial diagram of a guiding slot and guide pin, in cross-section, used with the sensor geometry of FIGS. 8A and 8B to permit the switching of polarity only at the zero or null position.

Turning now to the drawings there shown in FIG. 1 a square magnet 20 presumably mounted on a carrier, the magnet having edge portions overlapping four magnetically saturable cores 21a, 21b, 21c, 21d, which are presumed to be secured to a reference frame. The portions of the cores 21a–21d shown in dashed representation are overlapped by the magnet 20 and become saturated by the magnetic field emitted from the magnet 20. Electrical circuits (shown below in FIGS. 7A, 7B) can detect the differential overlap of the magnet 20 with the pairs of opposite cores (21a, 21c) and (21b, 21d) with a high degree of precision and linearity. The relative position of the magnet is sensed with infinite resolution and independent of the spacing or gap between the plane of the magnet 20 and the plane of the cores 21a–21d. With the magnet 20 as shown, the cores 21a–21d are all saturated in half of their entirety giving rise to a null condition in both the X and Y directions. It is readily appreciated, however, that an X displacement will differentially change the portions of the cores 21a, 21c which are saturated without changing the differential saturated portions of the cores 21b, 21d. Similarly, a displacement of the magnet 20 in the Y direction will cause a proportional differential saturation of the cores 21b, 21d without affecting the differentially saturated portions of the cores 21a, 21c. Thus, the differential saturation of the cores 21a, 21c independently give an indication of the X displacement of the magnet 20, while the cores 21b, 21d independently sense the displacement of the magnet 23 in the Y direction. Hence, if the magnet 20 is displaced to an arbitrary location such as the location 20', the X and Y coordinates of the displacement 22 are independently sensed.

FIG. 1 describes in theoretical terms the operation of a multi-directional contactless controller sensing the displacement of the magnet 20 in two orthogonal directions. In practice, however, additional means are required for constraining the motion of the magnet 20 along the two orthogonal directions and for preventing rotation of the magnet 20 with respect to the saturable cores. It should be noted, however, that in some applications such as video games, the sensing of the X and Y displacements need not be entirely independent. In this case, the magnet 20 could be of circular shape so that rotation of the magnet 20 with respect to the cores 21a–d is inconsequential and need not be prevented. Moreover, if the output of such a controller is converted to digital form, a numerical correction could remove the dependency of the indicated displacements $(X_o, Y_o)$ to obtain relatively independent displacements $(X', Y')$. An exemplary mathematical formula for an approximate numerical correction is:

$$X' = X_o(1 - a\ Y_o^2)$$

$$Y' = Y_o(1 - a\ X_o^2)$$

where the predetermined constant a is selected to cancel the X-Y dependency. The required correction is relatively small due to the fact that the pairs of cores sense differential saturation so that the dependencies of the two cores in each pair partially cancel.

To constrain motion of the magnet 20 along first and second orthogonal directions thereby preventing movement of the magnet in the third orthogonal direction, carrier means are provided having planar, cylindrical, or spherical geometry. A controller generally designated 24 having a planar geometry is shown in FIG. 2. Exposed to the user are a plate 25 providing the surface of a control console and a hockey-puck type manipulator 26 which may be moved in the X and Y directions with respect to the plane of the plate 25. On the underside of the plate 25 and thus shielded from the user, the magnet 20 is securely fixed to a squara carrier 27. A bolt 28 securely attaches the manipulator 26 to the carrier 27 and a cylindrical bushing 29 prevents the bolt 28 from clamping the manipulator 20 to the plate 25. The saturable cores 21a–d are secured to a printed circuit board 30 screwed to the underside of the plate 25 via screws 31 and stand-offs 32. The plate 25, in other words, establishes a reference frame about which the displacement of the carrier 27 is sensed. The manipulator 26 provides a means for the operator or user to adjust the position of the carrier 27 with respect to the reference frame. It should be noted that there is no electrical contact between the magnet 20 and the saturable cores 21; in fact, there is no physical contact. For the purpose of interpreting the claims, by "contactless" it is meant that relative position is sensed by means other than an electrical contact or connection. The advantage of a "contactless" controller is that, unlike a conventional potentiometer, the response of the sensor is insensitive to the condition of the interface between the moving parts. In FIG. 2, the complete separation between the magnet 20 and the saturable cores 21a-d facilitates assembly of the controller 24. The saturable cores 21a-d, for example, could be mounted on the same printed circuit board 30 upon which the video game circuits are mounted. Thus, there is no labor involved in connecting the multi-directional contactless controller 24 to the video game circuits.

For linear and independent displacement sensing in the X and Y directions, the magnet 20 should be square rather than circular and means are required for preventing rotation of the carrier 27 with respect to the reference frame or plate 25. For this purpose, a guide plate 33 is inserted between the carrier 27 and the plate 25. As shown in FIG. 3, the guide plate 33 has two upper grooves or slots 34 along the Y direction and two lower grooves 35 in the X direction. The upper grooves 34 engage with four set screws 36 threaded in and depending from the underside of the reference frame or plate 25 and the lower grooves 35 engage with four set screws 37 threaded into the carrier 27. The upper slots 34 and set screws 36 constrain displacement of the guide plate 33 to along the Y direction with respect to the reference frame 25, and further prevent rotation of the guide plate 33 with respect to the reference frame 25. The lower grooves 35 and set screws 37 permit the carrier 27 to move only in the X direction with respect to the guide plate 33, thereby permitting the carrier 27 to move in both the X and Y directions with respect to the reference frame or plate 25, but preventing rotation of the carrier 27 with respect to the guide plate 33 and thus also with respect to the reference frame or plate 25.

FIG. 3 shows, in pantom lines, the positions of the components for the planar germetry controller 24 when the manipulator 26 is displaced to the upper right-hand corner limit position. It should be noted that at this limit position the cores 21a, 21b in the positive X and Y directions, respectively, just become saturated in their entirety, and the cores 21c and 21d, in the negative X and Y directions, respectively, just beoome unsaturated in their entirety by the magnetic field of the magnet 20. The X and Y limit positions are defined by contact of the outer circumference of the bushing 29 with a generally square aperture 38 punched or milled in the reference plate 25.

Turning now to FIG. 4, there is shown a cylindrical geometry controller generally designated 40 having a cylindrical carrier 41 telescopingly received in a cylindrical frame 42. A square or rectangular magnet 43 has edges aligned with the axial Z and circumferential θ directions of the cylinder of the carrier 41. The magnet 43 is shown fixed to the carrier 41 and the saturable cores 44 are shown fixed to the frame 42. The cores 44, for example, are received into apertures milled into the frame 42 and secured there by an adhesive or potting compound such as epoxy. The magnet 43, for example, is also received in a milled in or turned down portion of the carrier 41 and glued in place. The relation between the carrier 43 and saturable cores 44 is similar to the arrangement shown in FIG. 1, it being understood that the geometry of FIG. 1 is merely distorted by aligning the X direction in FIG. 1 with the Z direction of FIG. 4, and bending the plane of FIG. 1 so that the Y direction of FIG. 1 corresponds to the θ direction of FIG. 4. A manipulator 45 having a handlebar-type grip is attached to the carrier 41. An aperture 47 is milled into the carrier 41 to receive a pin or bolt 46 screwed into and inwardly extending from the reference frame 42 so as to define the limit positions in the Z and θ directions of the carrier 41 with respect to the frame 42. The pin 46 and aperture 47, in other words, performs the same function as the aperture 38 and bushing 29 in FIG. 3. It should be noted that unlike the planar configuration 24 in FIGS. 2 and 3, the cylindrical embodiment 40 in FIG. 4 inherently prevents rotation of the carrier 41 with respect to the frame 42 about any radial axis.

Shown in FIG. 5 is a multi-directional contactless controller 50 having a spherical geometry. A spherical carrier 51 is received in a generally spherical reference frame generally designated 52, having a bottom part 53 and a top part 54 making up a socket which receives the carrier 51. Four machine screws 55 are shown for securing the controller 50 to a control panel (not shown). A manipulator generally designated 56 is comprised of a palm rest 57 and a threaded shaft 58 fixing the palm rest 57 to the carrier 51. Thus, the manipulator 56 may be used to pivot the carrier 51 about its center along two orthogonal directions, for example, forward-and-back and side-to-side (designating the directions of displacement of the palm rest 57), as well as in any orbicular pattern within established limits.

An annular magnet 59 corresponding to part of a hemisphere is received in and secured to the carrier 51. The magnet 59 differentially saturates diametrically opposed pairs of saturable cores 60 at 90° locations about the axis of the shaft 58 when the shaft 58 is vertical. When the shaft 58 is vertical, one half of each of the cores 60 is saturated by the hemispherical edge portion of the annular magnet 59. The pairs of diametrically opposite cores 60 become differentially saturated, however, when the manipulator 56 tilts forward-and-back or side-to-side. It is evident, from the radial symmetry of the hemispherical edge portion of the magnet 59, that the differential saturation of the pairs of cores 60 independently senses the forward-and-back, and side-to-side, displacement of the manipulator 56 regardless of any rotation of the carrier 51 about the axis of the shaft 58. The cores 60 have a slightly bent shape conforming to the curvature of the spherical carrier 51. For small scale production, the curved cores 60 are conveniently fabricated by winding a strip of permeable metal such as mu-metal about a bent wire or other curved preform, or by bending mu-metal tubes or soft ferrite cores. The cores 60 are glued, potted or molded into holders 61 which are clamped between the lower 53 and upper 54 parts of the frame 52. Bores 62 provide access for sensing wires 63 to the cores 60.

The limit of travel of the carrier 51 with respect to the frame 52 is defined by an aperture 64 in the upper part of the frame 52. The spherical embodiment 50 also has spring-biased means generally designated 65 for asserting an impeding force on the manipulator 57 with respect to the frame 52 over the permitted range of travel of the carrier 51. A bore 66 receives a spring 67 for biasing a cam follower 68 against a cam 69. The surface of the cam 69 is generally conical to provide a net torque on the carrier 51 tending to restore the manipulator 56 to its center vertical position. The cam 69 is preferably fashioned with a central detent 70 for providing a repetitively uniform center position and some locking force, and may also have detents or channels to define preferred positions or preferred directions of movement for the manipulator 56. The surface of the cam 69 may be "programmed," by selecting the cam surface to provide any desired impeding force or self-actuating force on the manipulator 56 as a function of the displacement of the carrier 51 with respect to the reference frame 52 in both the front-to-back and side-to-side directions of motion of the manipulator.

Now that planar 24 cylindrical 40, and spherical 50 embodiments of a bi-directional controller have been disclosed, the circuitry shown in FIG. 7A and FIG. 7B for converting the differential saturation of the cores to a useful electrical indication will be described. It should be noted, however, that the general problem of converting differential saturation of the cores to an output voltage has been solved in the prior art for contactless controllers sensing a single linear or rotary displacement. Thus, for each orthogonal direction of motion to be detected, an electrical circuit of known construction may be used. Preferred circuits are shown in FIG. 7A and FIG. 7B. The magnet material used for the magnet 20 is a staple of commerce consisting of a flexible sheet of plastic loaded with particles of barium ferrite or equivalent. The material comes in various thicknesses and may be cut to a desired shape following which it may be permanently magnetized. The material is available as a staple of commerce from a number of different sources including 3M Company, Industrial Electrical Products Division, 3M Center, St. Paul, Minn. 55101 or from Bunting Magnetics Co., 500 South Spencer Avenue, Newton, Kans. 67114. The saturable cores 21$b$, 21$d$ are also a staple of commerce. Soft ferrite cores may be obtained from Indiana General, Valparaiso, Ind. 46383, Stackpole Company, St. Mary's, Pa. 15857, or Ceramic Magnetics Inc., Fairfield, N.J. 07006. Mu-metal is available from Mu Shield Co., Malden, MA 02148 and Carpenter Technology Corp., Reading, PA 19603.

As shown in FIG. 7;, the saturable cores 21$b$, 21$d$ are tubular and are threaded with one or more "pick-up" turns 141, 142 which sense the difierential saturation of the tubes 21$b$, 21$d$. An oscillator 143 generates an excitation signal of about one kilohertz which is coupled to the pickup turns 141, 142 by a capacitor 144. As shown, the excitation $V_{in}$ is applied across the pickup turns 141, 142 connected in series with respect to ground. An output signal $V_{out}$ appears at the midpoint or tap 145 connecting the pickup turns 141, 142. Since the pickup turns 141, 142 constitute the two impedances of a voltage divider, the output and excitation signals are related to the fractional inductance $\alpha$ (of the lower tube 21$d$) and the non-saturated self-inductance L according to:

$$\frac{V_{out}}{V_{in}} = \frac{\alpha L}{L + (1-\alpha)L} = \alpha$$

The fractional inductance $\alpha$ is one-half for the middle position of the magnet 20 as shown. The self-inductance of the lower tube 21$d$ is $\alpha$L and the self-inductance of the upper tube 21$b$ is $(1-\alpha)$L. In other worls, $\alpha$ is an indication of the proportional part of each core that is saturated or unsaturated, and therefore senses the rela- tive displacement of the magnet 20 with respect to the cores 20$b$, 20$d$. Hence, the amplitude of the output signal $V_{out}$ is a linear function of the fractional inductance $\alpha$ and thus the relative difference in saturated volume of material between the two cores 21$b$, 21$d$, compared to total volume, referred to as "differential saturation" herein. Thus, the differential saturation is equal to $\alpha - \frac{1}{2}$, having a value of zero at the null position and limits of $+\frac{1}{2}$ or $-\frac{1}{2}$ at extreme positions of relative displacement of the magnet 20 with respect to the cores 20$b$, 20$d$.

In order to generate a DC electrical control signal $V_{out}'$ from the AC output signal $V_{out}$, an AC signal detector 146 generates a DC signal proportional to AC amplitude. A directional diode, for example, may be used, although more precise amplitude or peak detectors are available as integrated circuits. A signal conditioning chip, Part No. 80330057 manufactured by Interdesign Corp., is especially useful since it includes an oscillator as well as a peak detector. A demodulation or low-pass filter capacitor 147 shunts the AC signal detector 146 output to ground.

In order to independently adjust the span or range of DC signal $V_{out}'$, for a given position deviation of the magnet 20, and the zero point of the DC signal $V_{out}'$, a buffer amplifier 148 is provided having independent gain and offset controls 149, 150, respectively. The gain of the operational amplifier 148 is set by the resistance ratio of the adjustable resistor 149 and a series input resistor 151. The potentiometer 150 selects the zero or bias point of the amplifier 148 as a point between the positive +V and negative −V supply voltages.

During an initial calibration step, the span adjust control 149 is set midrange and the magnet 20 is placed in the desired center reference position. Then the zero adjust control 150 is adjusted to obtain a zero output voltage $V_{out}'$, with respect to ground. Finally, the magnet 20 is moved along the axis of the tubes 21$b$, 21$d$ to a full-scale position, and the span adjust control 149 is adjusted for the desired fullscale scale voltage $V_{out}'$, with respect to ground.

In FIG. 7A the satrrable cores or tubes are wired as inductors with single drive and pickup coils 21$b$, 21$d$ to sense differential self-inductance. Alternatively, as shown in FIG. 7B, secondary or sense coils 152, 153, respectvely, may also be wound to sense the differential mutual inductance of the tubes. In this manner, the saturable tubes 21$b$, 21$d$ and coils 141, 142, 152, 153 comprise a differential transformer which generates a balanced output signal $V_{out}''$. The amplitude of the balanced output $V_{out}''$ is proportional to the axial displacement of the magnet 20 from the center reference position, while the phase or polarity of the output signal $V_{out}''$ is indicative of the particular direction from the center reference position. The differential connection of FIG. 7B has noise and interference rejection advantages over the single-ended connection of FIG. 7A, but it requires a balanced product detector (e.g., diode ring or switching demodulator such as IC Part No. 4016) for the AC signal detector 146 in order to compare the phase of the AC output signal $V_{out}''$ to the phase of the oscillator 143 output. But the balanced circuit of FIG. 7B is conveniently used for remote control, since a shielded twisted pair signal cable 154 provides excellent isolation from external electromagnetic interference.

In accordance with another feature of the present invention, the polarity of the indication for one direction of control is selected by another direction of control. Although this feature can be incorporated into both the planar geometry control 24 of FIG. 2 and the cylindrical geometry control 40 of FIG. 4, it is preferably incorporated into the cylindrical geometry control 40 so that the position of the manipulator 47 indicates the selection of the polarity. In any case, however, the magnet geometry of FIGS. 8A and 8B is preferably employed. Since the response is linear in only one direction, only one pair of cores 44'a and 44'c is required. The reference numerals correspond to the cylindrical geometry of FIG. 4, so that the response is linear in the Z direction. But due to the configuration of the magnet 43', an angular displacement of the carrier 41, resulting in a shift of the magnet 43 in the direction of the arrows, reverses the polarity of the displacement sensed by the saturable cores 44'a, 44'c without altering the indicated magnitude of the displacement. By comparison of the relative positions of the magnet 43' and the cores 44'a–44'c in FIG. 8A versus FIG. 8B, it is observed that relative motion of the magnet 43' induced by rotation of the carrier 41 (FIG. 4) causes tha previously saturated portions of the cores (i.e., the portions shown in dashed representation) to become unsaturated and the previously unsaturated portions of the cores to become saturated. Preferably means are provided for preventing polarity reversal when the displacement indicated by the saturable cores 44'a, 44'c is substantial. As shown in FIG. 9, the limit stop aperture 47 of FIG. 4 is modified to conform to an "H" pattern 47' so that the pin 46 prevents the angular displacement of the magnet 43' from occurring unless the magnet 43' is in its null or center position along the Z direction. It should be noted that if the angular extent of the magnet 43' is approximately 360°, so that the left and right vertical sides of the bars of the "H" pattern 47' subtend 180°, then the handle of the manipulator 45 is inverted between the to polarity positions of FIG. 8A and FIG. 8B. Thus, when the handle 47 is in its right side up position, the polarity may be chosen positive, and when the handle is in its upside down position, the polarity of the displacement sensed by the cores 44'a–c, will be negative. If the limit stop has the "H" pattern 47', the handle 47 is locked into either the rightside up or upside down position when the handle 47 is actuated or displaced along the Z direction away from the null position.

In accordance with another feature of the invention, the manipulator means is flexibly connected to the carrier for relative motion with respect to the carrier in a direction different than the first and second orthogonal directions sensed by the multi-directional controllers of FIGS. 2–6, and means are further provided for sensing the relative motion of the manipulator with respect to the carrier. In other words, it is possible to modify the controllers of FIGS. 2–6 in order to provide at least three axes or directions of control. In one embodiment, the manipulator comprises a "squeeze" type manipulator shown in FIGS. 20, 24, 25, and 26 of U.S. Pat. No. 4,332,177 and as described beginning in Column 11, line 3, herein incorporated by reference. In another embodiment, the joystick controller of FIG. 5 is attached via the screws 55 to the hockey-puck manipulator 26 of FIG. 2 in order to provide a four axis control. Electrical connections from the joystick control FIG. 5 to the underside of the plate 25 of the control panel is provided, for example, by a central bore through the bolt 28. In this embodiment it is preferable to use a grip or handlebar type manipulator as shown in FIG. 4 instead of the palm rest manipulator 57 shown in FIG. 5. In other words, the operator must get a firm grip on the manipulator 56 in order to adjust the tilt of the stick 56 sensed by the spherical controller 50 independent of the translation of the stick in the X and Y directions which is sensed by the planar geometry controller 24 of FIG. 2.

Figure 10:
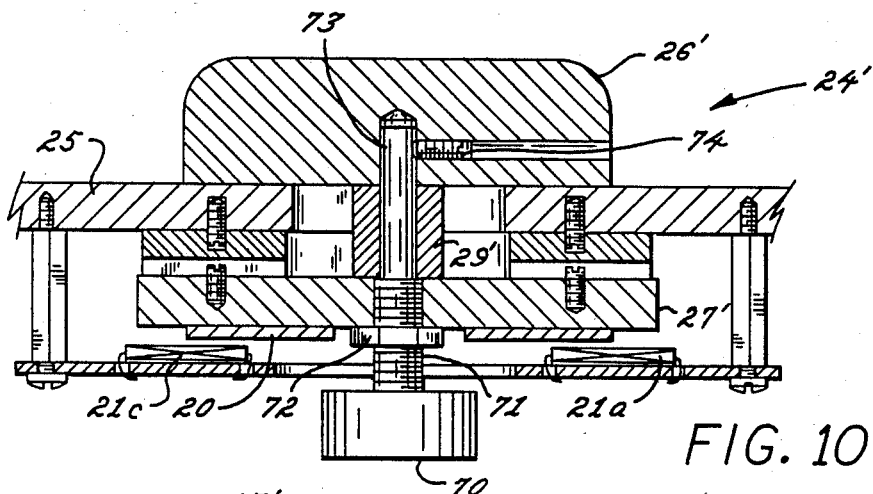
FIG. 10 is an elevation view, in cross-section, showing the modification of the two-axis controller of FIG. 2 to make a three-axis controller.
Figures 11, 12:
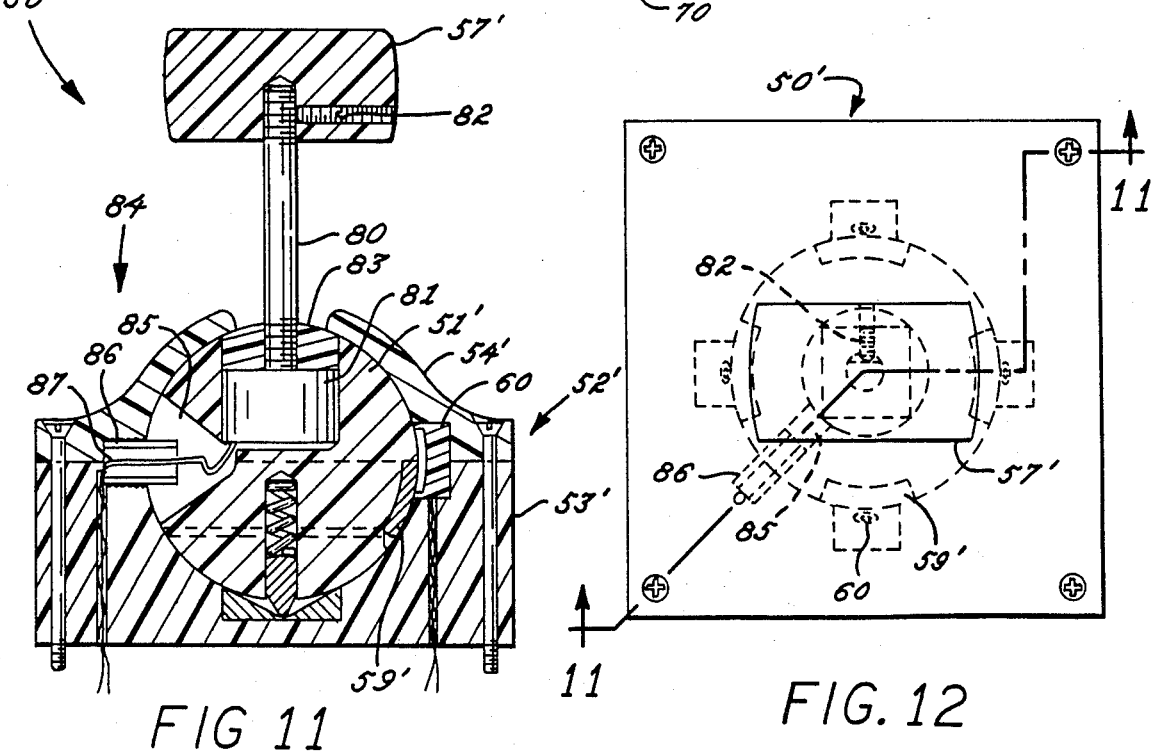
FIG. 11 is a cross-sectional elevation view along section line 11—11 in FIG. 12 showing how to modify the joystick controller of F1G. 5 to sense movement about three axes.
FIG. 12 is a plan view of the three-axis controller of FIG. 11.

Embodiments of three-axis controllers are shown in FIG. 10, FIG. 11 and FIG. 12. For the planar geometry of FIG. 10, the two-axis controller 24 of FIG. 2 is easily converted to the three-axis controller 24' of FIG. 10 by journaling the manipulator 26' to the carrier 27' via a rotary-type control 70. For low-cost applications the rotary control 70 is merely a potentiometer, although preferably it is a contactless rotary control such as is described in Bowman, Jr. et al., U.S. Pat. No. 4,088,977 issued May 9, 1978. The body of the rotary control 70 is firmly attached to the carrier 27 by its threaded extension 71 and a jam nut 72. The manipulator 26' is secured to the shaft 73 of the control 70 via a set screw 74. A bushing 29' is used with an inside diameter slightly greater than the diameter of the shaft 73.

Shown in FIG. 11 is a spherical geometry controller 50' responsive to three dirertions of control. The manipulator 57' is journaled for rotatior with respect to the carrier 51' by securing the manipulator 57' to the shaft 80 of a rotary control 81. A set screw 82 ensures that the manipulator 57' does not rotate with respect to the shaft 80. In contrast to the palm rest 57 in FIG. 5, the manipulator 57' is cylindrical so that it may be easily grasped and rotated by the user. The rotary control 81 is received in a bore in the carrier 51' and is sealed by suitable potting compound 83.

Means generally designated 84 are provided to prevent the carrier 51' from rotating with respect to the frame 52'. An arcuate slot 85 is provided in the carrier 51' to receive a tubular pin 86 having its axis along the radial direction of the sphere of the carrier 51'. The pin 86 is clamped between the lower part 53' and the upper part 54' of the frame 52', the pin 86 being knurled externally to be securely gripped by the lower and upper parts of the frame. The width of the arcuate groove 85 matches the outer diameter of the pin 86 so that any forward-and-back or side-to-side motion of the manipulator 57' causes either a rotation of the carrier 51' about the axis of the tubular pin 86, or in effect causes a circumferential displacement of the tube 86 within the arcuate slot 85 with respect to the carrier 51'. The tube 86, however, abuts against the opposing faces of the arcuate slot 85 to prevent rotation of the carrier 51' with respect to the axis of the rotary control shaft 80 since the axis of the rotary control shaft 80 is parallel to the longitudinal axis of the arcuate slot 85. The pin 86 is tubular to provide access for the control wires 87 from the rotary control 81. It should be also noted that since means 84 are provided to prevent rotation of the carrier 51' with respect to the axis of the control shaft 80, the magnet 59' need not be annular or continuous around the entire circumference of the carrier 51'. It may, for example, be segmented into separate generally square but slightly curved sections 59', one section 59' being supplied for each saturable core 60.

In the above-described embodiments, the magnet has been fixed to the carrier and the cores have been fixed to the reference frame. But it is evident that the positions of the cores and the magnet may be interchanged. In fact, if the magnet is segmented (e.g., as in FIG. 12) some of the cores may be secured to the carrier and the others may be secured to the reference frame, the cores secured to the carrier being adjacent to the magnet sections secured to the reference frame. Moreover, other kinds of contactless sensors could be used in lieu of the magnet and core combination. A light emitter such as an edgeilluminated sheet of lucite, for example, could be substituted for the magnet (20 FIG. 1) and the pairs of cores (21a, b), (21b, c) could be replaced by two light sensing linear CCD arrays, such as part No. CCD111ADC, a 256 element sensor manufactured by Fairchild Corp. A sensor array is advantageous in providing a digital output referenced to the stable physical locations of the array elements. Linear arrays of Hall effect magnetic sensors could be directly substituted for the pairs of saturable cores if and when such arrays become commercially available. The linear array, in other words, is a linear sensor responsive to the edge portion of a source of light or magnetic field that overlaps or excites a portion of the array.

Figure 13:
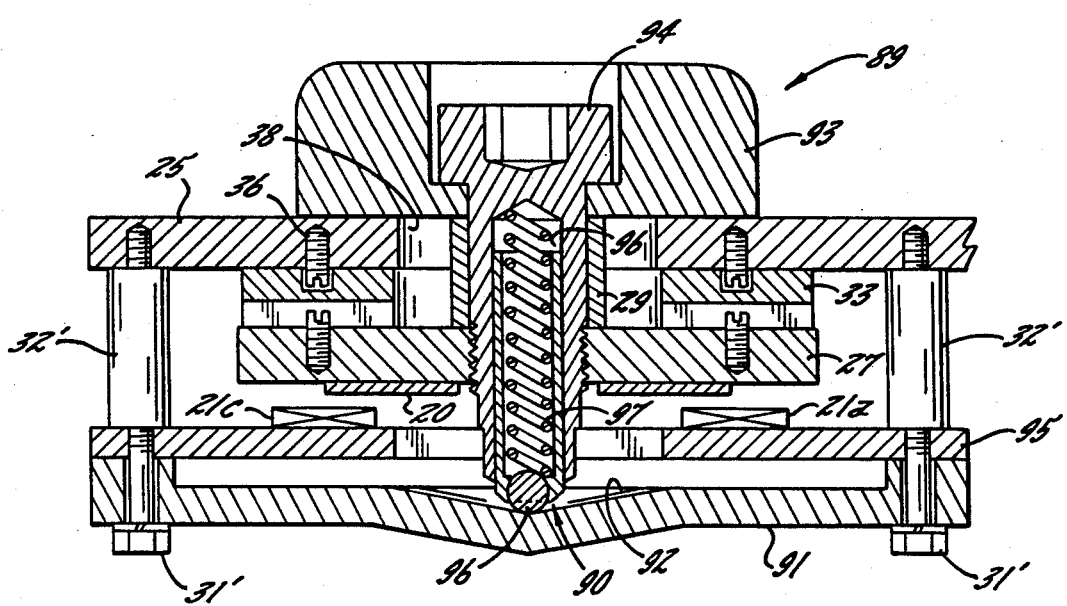
FIG. 13 is a cross-sectional elevation showing modifications to the controller of FIGS. 2 and 3 which provide a programmed return force tending to bring the manipulator to its central null position.

As described above in connection with FIG. 5, a resiliently biased cam follower 68 and a cam 69 can be disposed between the manipulator and the frame for providing a restoring force, an impeding force, or a self-actuating force on the manipulator as a function of displacement with respect to the frame. Turning now to FIG. 13, there is shown such a cam and cam follower disposed between a manipulator 93 and the frame 25 for a planar geometry controller 89 similar to the controller of FIGS. 2 and 3. The components in FIG. 13 which are similar to the components in FIGS. 2 and 3 are designated by the same reference numerals.

In order to dispose a cam follower 90 and a plate 91 defining a cam surface 92 between the manipulator 93 and the frame 25, the cam follower 90 is mounted in a bolt 94 which secures the manipulator 93 to the carrier 27, and the plate 91 defining the cam surface 92 is mounted to the frame 25 by bolts 31'. So that the plate 91 is rigidly mounted to the frame 25, extra large spacers 32' are provided and also a metal plate 95 is used for mounting the cores 21a, 21c. To engage the cam follower 90 with the cam surface 92, the cam follower 90 is in the form of a cylinder received in a bore 96 including a compression spring 97.

As shown in FIG. 13, the cam surface 92 is in the form of a cone having its apex at the central position of the region of displacement for the manipulator 93. Therefore, the cam and cam follower arrangement of FIG. 13 provides a constant force tending to restore the manipulator 93 to the central position. To reduce friction between the cam follower 90 and the cam plate, the cam follower includes a hardened steel ball bearing 96.

Figure 14:
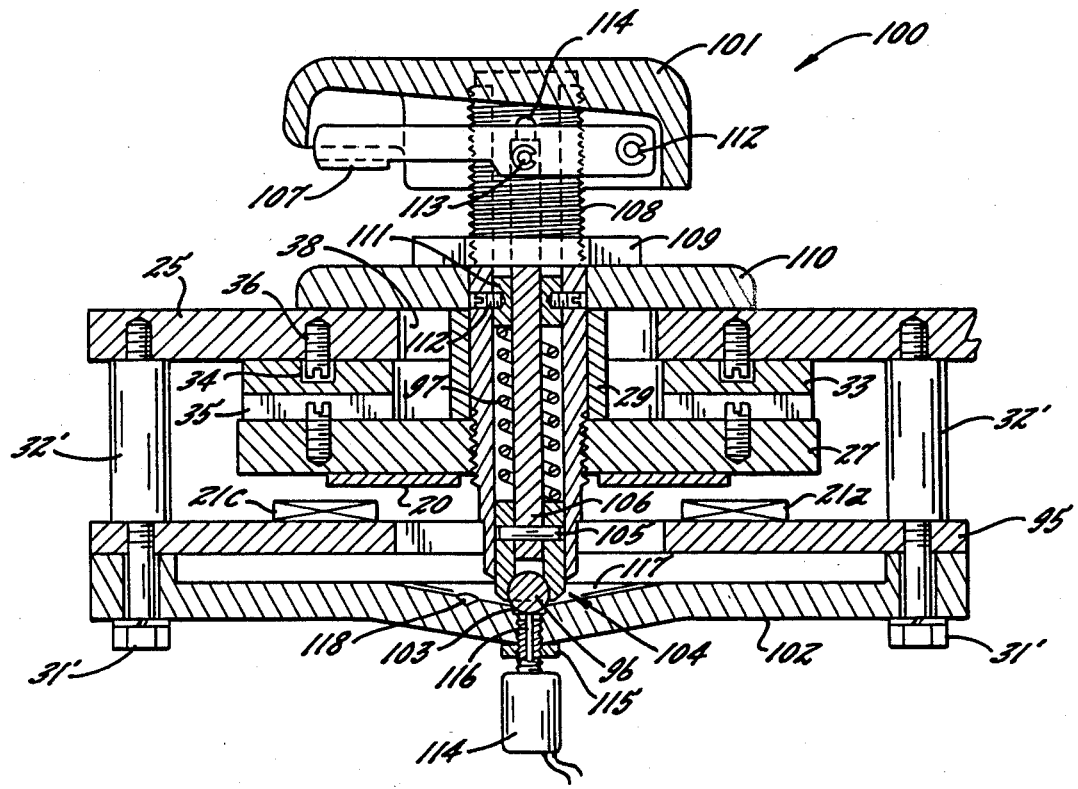
FIG. 14 is a cross-sectional elevation showing modifications to the controller of FIG. 13 so that overt manual input is required to enable the manipulator to be displaced from the central null position.

For more critical applications, such as for controlling earth moving equipment, it is desirable to lock the manipulator in its central position until an overt manual input is applied to the controller. Turning now to FIG. 14 there is shown a controller generally designated 100 which provides this capability. In order to lock the manipulator 101 in its central position, a cam plate 102 includes a central bore 103 having a diameter slightly less than the diameter of the ball bearing 96 in the cam follower 104. Since the diameter of the bore 103 is slightly smaller than the diameter of the ball bearing 96, a transverse force or the manipulator 101 will not disengage the ball bearirg 96 from the bore 103.

In order to provide a means for selectively disengaging the ball bearing 96 from the bore 103, the cam follower 104 is fastened via a pin 105 to a shaft 106 which is displaced by a finger-tip operated lever 107 disposed underneath the manipulator 101. The manipulator 101 is threaded to a hollow shaft 108 which is in turn threaded to the carrier 27 and is also threaded to a nut 109 which clamps a cover plate 110 to the spacer 29. The spring 97 is entrained by a cylindrical bearing 111 retained in the hollow shaft 108 by set screws 112. The finger-tip operated lever 107 is pivotally mounted to the manipulator 101 by a pin 112 and is connected to the shaft 106 by a pin 113 which extends transversely through the hollow shaft 108 through a pair of diametrically-opposed slots 114.

Figure 15:
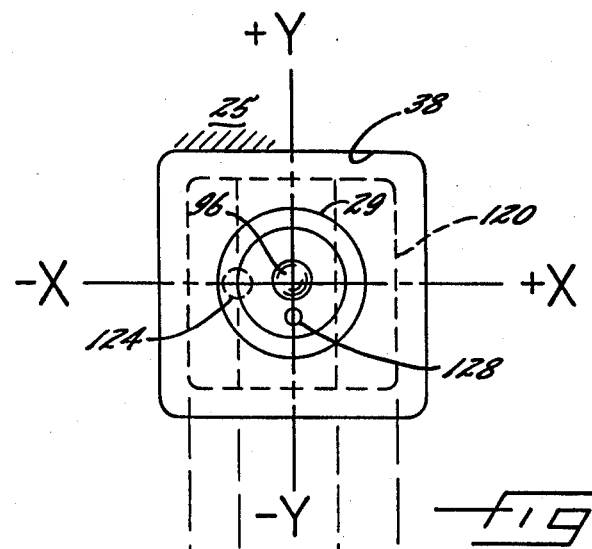
FIG. 15 is a plan view of a cam surface having a number of regions for providing programmed tactile feedback along two orthogonal axes.

In order to sense when the manipulator 101 is locked in its central position, for example, to inhibit machinery being controlled by the controller 100, a plunger-type switch 114 is threaded into the cam plate 102 and secured by a nut 115. As shown in FIG. 15, when the manipulator 101 is locked in its central position, the ball bearing 96 depresses the plunger 116 of the switch 114.

As further shown in FIG. 14, the surface 117 of the cam plate 102 may include one or more non-locking detents 118 in addition to locking detents in the form of the bore 103. The non-locking detent may select, for example, a non-critical but frequently used position of a machine being controlled.

As mentioned above in connection with FIG. 5, the cam surface may be "programmed" by machining the cam surface to provide any desired impeding force or self-actuating force on the manipulator as a function of the displacement with respect to the reference frame in both the front-to-back and side-to-side directions of motion of the manipulator. This is further illustrated in FIGS. 15, 16 and 17. FIG. 15 shows the relationship between the aperture 38 in the frame 25, the bushing 29, and a cam surface 120 which is shown in dashed lines and which has been programmed for a special application.

Figure 16:
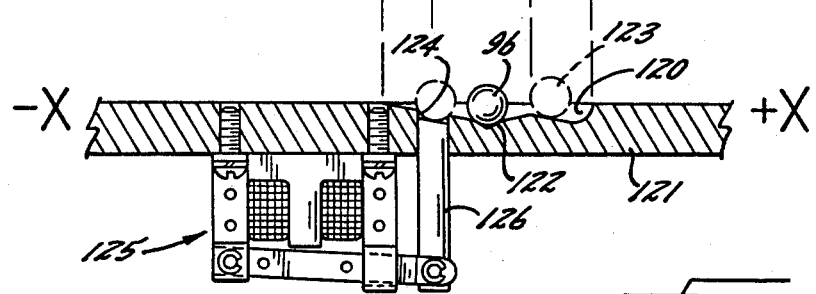
FIG. 16 is a cross-sectional view of the cam surface of FIG. 15 along the X direction and showing a mechanism for selectively disengaging the manipulator from a detent position.

As shown in FIG. 16, the cam surface 120 has been milled in a cam plate 121 so as to define a detent 122 for the ball bearing 96 at the central position, and also to define a second rest position 123 at the limit of travel of the manipulator in the +X direction. The ball bearing 96 is designated 123 in this second equilibrium position. Although this second position is defined for a specific +X value, it extends along the Y direction. The cam plate 121 is also provided with a bore 124 defining a third rest position at the X and Y coordinates at the center of the bore. The diameter of the bore 124 is selected to be slightly less than the diameter of the ball bearing 96, so that the manipulator becomes locked at this third rest position.

In order to selectively unlock the manipulator from the third rest position, there is provided a heavy duty solenoid generally designated 125 connected to a plunger 126 disposed in the bore 124. Therefore, when the ball bearing 96 is seated in the bore 124 at the third rest position, the plunger 126 will unseat the ball bearing from the bore when the sclenoid 125 is energized, thereby unlocking the manipulator from the third rest position.

Figure 17:
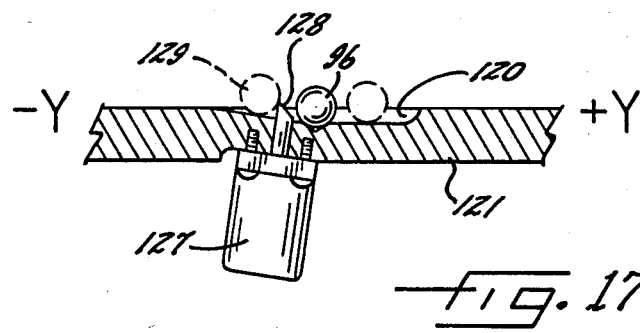
FIG. 17 is a cross-sectional view of the cam surface of FIG. 15 along the Y direction and showing a mechanism for selectively preventing displacement of the manipulator. de While the invention has been described in connection with certain preferred embodiments, it will be understood that there is no intention to limit the invention to the particular embodiments which have been illustrated, but it has been intended, on the contrary, to cover the various alternative and equivalent forms of the invention included within the spirit and scope of the apperded claims.

Turning to FIG. 17, there are shown means for selectively inhibiting travel of the manipulator from one region of its range of travel to another. A medium duty solenoid 127 has a plunger 128 which normally protrudes from the cam surface 120 but which is retracted beneath the cam surface when the solenoid is energized. The plunger 128 also has a beveled end face so that the manipulator can be moved so that the ball bearing 96 travels from the central position to a limit position 129 in the -Y direction, regardless of whether the solenoid 127 is energized. However, at the limit position 129, the solenoid 127 must be energized to permit travel directly back to the central position. It should be apparent from FIG. 15, however, that the manipulator could be moved in a direction so as to circumscribe the plunger 128 to return to the central position, even when the solenoid 127 is not energized. Therefore, the solenoid 127 is conveniently used to define a particular region occupied by the plunger 128 which is a normally prohibited region in the X and Y plane. If the plunger 128 had a square rather than a beveled end face, for example, the region occupied by the plunger would be prohibited unless the solenoid were energized regardless of the initial position or direction of travel of the manipulator toward the prohibited region.

Although FIGS. 15, 16 and 17 have been described in terms of a cam surface 120 for the planar geometry controllers of FIGS. 13 or 14, it should be apparent that the same concepts are readily applicable to the spherical controller of FIGS. 5 or 11. Similarly, these principles can be applied to the cylindrical geometry controller of FIG. 4, preferably by mounting the spring loaded cam at the location of the pin 46 in FIG. 4, and providing the outer cylindrical frame 42 with a cam surface on its inner surface in the region of the aperture 47 in FIG. 4. As described above in connection with FIG. 9, for example, the pin 42 functions as a cam follower and the H-shaped slot 47 functions as a cam surface to constrain movement of the cylindrical carrier 41 along a predetermined ourve in the Z-$\theta$ plane.

In view of the above, there have been described a number of multi-directional contactless controllers that are rugged, reliable, and economical to manufacture. A cam and cam follower are disposed between the manipulator and the frame in order to provide programmable and selectable tactile feedback to the operator. For general purpose applications, the cam is programmed to provide precise offset and return forces which are, for example, are substantially constant over a wide range of displacement. By providing a sufficient degree of slope on the cam surface, the manipulator is reliably returned to its central or null position in the event that the controller becomes unattended in an emergency situation. Moreover, by providing a finger-tip control lever for disengaging the cam follower from the cam, the cam can be programmed so that overt manual input is required in order to permit the manipulator to be displaced toward or away from certain programmed regions. Moreover, solenoids have been described for both selectively unlocking the manipulator from certain positions and for preventing the manipulator from being moved into certain regions. Therefore, the controller is readily adapted for special circumstances so that the operator obtains tactile feedback corresponding to the physical operation being controlled.

What is claimed is:

1. A multi-directional controller comprising a reference frame and a carrier, means for guiding the carrier with respect to the reference frame in first and second generally orthogoal directios while restraining motion of the carrier with respect to the reference frame in a third direction generally orthogonal to said first and second diectios, manipulator means connected to the carrier for manually positioning the carrier with respect to the reference frame in the first and second directions, and means for sensing the displacement of the carrier with respect to the reference frame along said first and second directions, wherein said multi-directional controller further comprises cam and cam follower means disposed between said carrier and said reference frame for providing forces between said carrier and said reference frame which are a predetermined function of the displacement of said carrier with respect to said frame in each of said first and second orthogonal directions, and wherein said cam and cam follower means includs a cam follower and a cam, said cam follower engaging said cam and travelling in two orthogonal directions over a two-dimensional regin of said cam as said carrier is manually positioned with respect to said reference frame over a two-dimensional region of trave defined by said first and second orthogonal directions, and said two-dimensional region of said cam is programmed to provide a desired reaction force as a predetermined function of position of said carrier with respect to said frame.

2. The multi-directional controller as claimed in claim 1, wherein said cam comprises a plate defining a cam surface extending in said first and second directions, and said cam follower is urged by a spring along said third direction to contact said cam surface.

3. The multi-directional controller as claimed in claim 2, wherein said plate is fixed to said reference frame and said cam follower is mounted to said carrier and said manipulator.

4. The multi-directional controller as claimed in claim 2, wherein said cam follower includes a ball bearing urged by said spring to contact said cam surface.

5. The multi-directional controller as claimed in claim 2, further comprising manual imput means for permitting an operator to move said cam follower along said third direction to disengage said cam follower from said cam surface without moving said manipulator along either of said first and second directions.

6. The multi-directional controller as claimed in claim 5, wherein said cam surface defines at least one depression defining a rest position of said manipulator at which said cam engages said cam surface and thereafter overt manual input via said manual input means is required to disengage said cam from said cam surface to enable said carrier to be displaced along said first and second directions.

7. The multi-directional controller as claimed in claim 1, wherein said cam and cam follower means provides sufficient force to return said carrier to a reference position in the absence of manual operation of said manipulator.

8. The multi-directional controller as claimed in claim 1, wherein said cam and cam follower means provides a substantially constant force tending to return said carrier to a reference position independent of the magnitude and direction of displacement of said carrier from said reference position for a substantial distance from said reference position.

9. The multi-directional controller as claimed in claim 1, wherein said cam and cam follower means define a detent position of said carrier with respect to said frame at which it is especially difficult for said carrier to be displaced along either of said first and second directions, and further comprising a disengaging means for selectively enabling said carrier to be displaced with respect to said frame away from said detent position.

10. The multi-directional control as claimed in claim 9, wherein said disengaging means includes a solenoid which is energized to enable said carrier to be displaced away from said detent position.

11. The multi-directional controller as claimed in claim 9, wherein said disengaging means includes means for overt operator input.

12. The multi-directional controller as claimed in claim 11, wherein said means for overt operator input includes a finger-tip control lever mounted to said manipulator.

13. The multi-directional conttoller as claimed in claim 1, wherein said region of said cam is programmed to provide said forces in different magnitudes and directions in respective areas of said region.

14. The multi-directional controller as claimed in claim 1, wherein said cam and cam follower means define a plurality of detent positions of said carrier with respect to said frame at which said cam and cam follower means provide restoring forces tending to impede displacement of said carrier.

15. The multi-directional controller as claimed in claim 14, further comprising at least one switch operated when said carrier is positioned in one of said detent positions.

16. The multi-directional controller as claimed in claim 1, wherein said cam and cam follower means include means for constraining movement of said carrier with respect to said frame along a predetermined curve in the region of travel defined by said first and second orthogonal directions.

17. The multi-directional controller as claimed in claim 1, further comprising means including a solenoid for selectively blocking displacement of said carrier with respect to said frame to exclude a certain area in the region of travel defined by said first and second orthogonal directions.

18. A multi-direction controller of the kind having a reference frame and a manipulator which is grasped by an operator and moved to a selected position within a region of operation defined by two orthogonal axes, and means for generating an electrical signal indicating the selected position of said manipulator, wherein said multi-directional controller includes a cam contacting a cam follower disposed between said manipulator and said reference frame for returning said manipulator to a predetermined reference position when said operator fails to grasp said manipulator, said cam follower travels in two orthogonalo directions over a two-dimensional region of said cam as said manipulator is moved to different positions within said region of operation, and said two-dimensional region of said cam is programmed to provide a desired return force on said manipulator of a predetermined function of position of said carrier.

19. The multi-directional controller as claimed in claim 18, wherein said cam and cam follower define a detent at said reference position and at which said cam engages said cam follower, and said multi-directional controller further comprises means for selectively disengaging said cam and cam follower in response to overt manual operation of a disengagement control mounted to said manipulator.

20. A multi-directional controller of the kind having a reference frame and a manipulator which is grasped by an operator and moved to a selected position within a region of operation defined by two orthogonal axes, and means for generating an electrical signal indicating the selected position of said manipulator, wherein said multi-directional controller includes a cam fixed to said reference frame and a cam follower mounted to said manipulator and urged by a spring to contact a surface of said cam, said cam follower travels in two orthogonal directions over a two-dimensional surface of said cam as said manipulator is moved to different positions within said region of operation, said two-dimensional surface of said cam is programmed to provide a desired force on said manipulator as a predetermined function of position of said carrier, and said cam surface includes a plurality of regions for providing forces of different respective magnitude and direction on said manipulator for tactile feedback to said operator.

* * * * *